(12) United States Patent
Baryudin et al.

(10) Patent No.: US 10,387,340 B1
(45) Date of Patent: Aug. 20, 2019

(54) MANAGING A NONVOLATILE MEDIUM BASED ON READ LATENCIES

(71) Applicant: Amazon Technologies, Inc., Seattle, WA (US)

(72) Inventors: Leonid Baryudin, San Jose, CA (US); Wenzhou Chen, Cupertino, CA (US)

(73) Assignee: Amazon Technologies, Inc., Seattle, WA (US)

( * ) Notice: Subject to any disclaimer, the term of this patent is extended or adjusted under 35 U.S.C. 154(b) by 71 days.

(21) Appl. No.: 15/447,546

(22) Filed: Mar. 2, 2017

(51) Int. Cl.
*G06F 13/16* (2006.01)
*G06F 3/06* (2006.01)
*G11C 16/16* (2006.01)
*G11C 16/26* (2006.01)

(52) U.S. Cl.
CPC .......... *G06F 13/1689* (2013.01); *G06F 3/064* (2013.01); *G06F 3/0613* (2013.01); *G06F 3/0634* (2013.01); *G06F 3/0647* (2013.01); *G06F 3/0679* (2013.01); *G11C 16/16* (2013.01); *G11C 16/26* (2013.01)

(58) Field of Classification Search
None
See application file for complete search history.

(56) References Cited

U.S. PATENT DOCUMENTS

| 2016/0188223 A1* | 6/2016 | Camp | G06F 3/0613 |
| | | | 711/103 |
| 2018/0173438 A1* | 6/2018 | Li | G06F 3/0619 |

OTHER PUBLICATIONS

The Storage Networking Industry Association, "Solid State Storage (SSS) Performance Test Specification (PTS) Enterprise", *SNIA Technical Position*, Version 1.1., Sep. 4, 2013, 176 pages.

\* cited by examiner

*Primary Examiner* — Scott C Sun
(74) *Attorney, Agent, or Firm* — Klarquist Sparkman, LLP

(57) ABSTRACT

The following description is directed to managing a nonvolatile medium. The nonvolatile medium can be organized as a plurality of storage units. In one example, a method can include measuring read latencies for the individual storage units of the nonvolatile medium. A probability distribution of future read latencies for the nonvolatile medium can be estimated based on the measured read latencies for the individual storage units of the nonvolatile medium. Information can be moved from a particular storage unit of the nonvolatile medium to a different storage unit of the nonvolatile medium based on the estimated probability distribution of future read latencies for the nonvolatile medium.

17 Claims, 9 Drawing Sheets

MANAGING A NONVOLATILE MEDIUM BASED ON READ LATENCIES

BACKGROUND

Computer systems generally use a memory hierarchy to meet the memory size and memory speed requirements for a given system. A memory hierarchy can include multiple levels of memory having different speeds and sizes. Levels within or closer to a processor core are generally faster and smaller than levels farther from the processor core. For example, the fastest level, closest to the processor core, can include a cache memory implemented with static random access memory (SRAM). An intermediate level can include main memory implemented with dynamic random access memory (DRAM). The next level further from the processor core can include block or bulk storage which is often implemented with a hard disk drive. An alternative form of bulk storage can be implemented using a solid-state nonvolatile medium such as flash memory. Flash memory and other solid-state technology can potentially provide an increase in speed, a decrease in power consumption, and an increase in shock-resistance compared to hard disk drives. However, solid-state nonvolatile media can have characteristics that need to be managed in order to maintain the integrity of information stored on the nonvolatile media and to maintain the operational life of the nonvolatile medium. For example, a given storage cell of a solid-state nonvolatile medium may only operate for a limited number of program-erase cycles before the given storage cell fails. As another example, information stored within a given storage cell can degrade or lose integrity over time and so the information may need to be refreshed by moving the information to a different storage cell. Thus, it can be desirable to manage where information is stored within the nonvolatile medium and when the information is to be moved within the nonvolatile medium.

DETAILED DESCRIPTION

Overview

Figure 1:
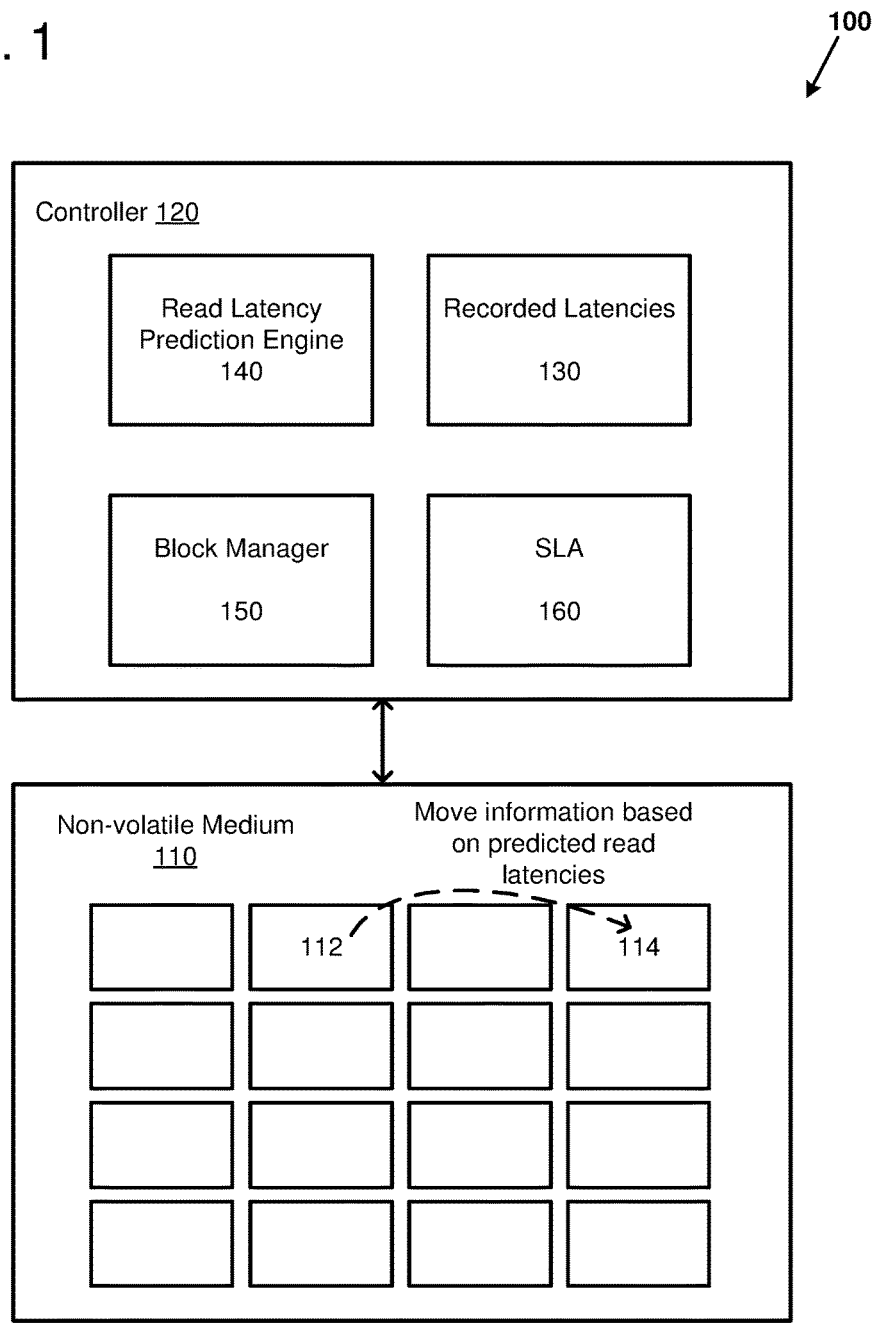
FIG. 1 is a system diagram showing an example of a nonvolatile storage device including a controller and a nonvolatile medium.

A nonvolatile medium (also referred to as a nonvolatile memory or NVM) is a computer-readable memory that retains information stored on it after power is removed from the nonvolatile medium. Rewriteable nonvolatile memory can be used as general purpose storage at one or more levels of the memory hierarchy of a computer system. Examples of solid-state rewriteable nonvolatile memory include Flash memory, electrically-erasable programmable read-only memory (EEPROM), ferroelectric random-access memory (FRAM), and magnetoresistive random-access memory (MRAM).

The nonvolatile memory can be organized in various arrangements based on a desired access time and/or access pattern of the memory. For example, a NAND flash memory can be organized into multiple physical blocks, where each physical block contains multiple flash memory cells that are all erased at the same time. A physical block can contain many bytes of information which can be partitioned into smaller groups of information. For example, the information stored on the physical block can be arranged in pages, where a page is typically the smallest amount of information that is written to or read from the flash memory in a given operation. As a specific example, a two gigabyte (GB) NAND flash memory can be arranged into 2,048 blocks, where each block is divided into 64 pages, and each page includes 1,056 16-bit words. The 1,056 16-bit words can be divided into 1,024 data words and 32 error-correcting code (ECC) words. As another example, NAND flash memories can be arranged in 600-700 pages per block, where the page size is eight kilobytes to sixteen kilobytes with 8% to 12% additional space for ECC parity words. The information read from a page of the flash memory can be transferred from the flash memory a byte or a word at a time. Similarly, the information written to a page of the flash memory can be transferred to the flash memory a byte or a word at a time.

Unlike some memory technologies that can be reprogrammed by merely overwriting a new value over an old value, a flash memory cell can be programmed (e.g., written) only after it is erased. In order to reprogram the flash memory cell, the entire physical block containing the cell is erased before the cell can be written with a new value. As described above, the physical block can contain many pages of information. In order to retain all of the information stored on the block, the information stored on any valid pages within the block must be stored outside of the block before the block is erased. For example, any valid pages within the block can be copied to a new location before erasing the block. However, moving valid pages from one location to another location can cause overhead that can decrease performance of a memory system. The amount of overhead caused by rewriting information that was stored on the flash memory can be quantified using a write amplification parameter. Specifically, write amplification can be defined as the ratio of the amount of data written to the flash memory divided by the amount of data written by a host to the flash memory. A smaller write amplification can indicate a more efficient system with low overhead and a larger write amplification can indicate a less efficient system with more overhead.

The information stored on the flash memory can be moved for various reasons such as increasing an effective capacity of the flash memory and maintaining the integrity of the information stored on the flash memory. Each flash memory device has a finite amount of storage capacity (e.g., 2 GB). As a computer system uses the flash memory, the storage locations of the flash memory can be filled with both valid information and invalid information. The status of the information can be tracked at a granularity of a page, so that each page can be classified as valid or invalid. Valid pages include information that can be used by an application to perform a function of the application. For example, the valid information can include instructions of an application or data used by an application. Thus, the information of a valid page should be available at a different location before erasing a block containing the information of the valid page to potentially avoid data loss. For example, the information of a valid page can be programmed at another location before erasing the block containing the valid page. Invalid pages can include information that cannot be used by an application to perform a function of the application. For example, invalid information can be an unused area of the flash memory or data that was discarded because the data was deleted or replaced with newer data. The information stored on an invalid page can merely be discarded when a block containing the invalid page is erased. Because the physical blocks can contain multiple pages, each of the blocks can include both valid and invalid pages. Moving the valid pages onto a common set of blocks with other valid pages (generally referred to as "garbage collection") can potentially increase a number of free blocks for storing information and/or increase a proportion of valid blocks on the flash memory. The blocks containing invalid pages and information that has been moved can be erased and reprogrammed with new valid data. In this manner, the capacity of the flash memory can be more efficiently utilized because the amount of valid information stored on the flash memory can be increased.

Additionally, the information stored in the pages of the flash memory can be moved so that the integrity of the data is maintained. The integrity of the data can be affected by environmental conditions, manufacturing variances, and operational conditions of the flash memory. For example, the information stored or programmed in a flash storage cell can potentially be corrupted when neighboring cells are read and/or when the device is subjected to high temperatures or is struck by an alpha particle or neutron. Thus, a charge or signal representing the information stored within a flash memory cell can degrade each time the block is accessed until the information is no longer recoverable. In one solution, a number of reads to a physical block can be tracked, and valid information stored within the block can be copied to a different block when the number of reads to the block exceed a threshold. By moving the information after a predefined number of reads, the information can be moved before it is corrupted due to an unintentional disturb caused by reads within the block. However, moving the information after the predefined number of reads to the block can potentially increase the write amplification, lower performance of the flash memory (due to the overhead operations being intermixed with host operations), and decrease the longevity of the flash memory.

As described above, a given storage cell of a solid-state nonvolatile medium may only operate for a limited number of program-erase cycles before the given storage cell fails. As a specific example, a given flash cell can be specified by a manufacturer to operate reliably for 3,000 program-erase cycles. Additional program-erase cycles above the specified limit may result in permanent damage to the flash cell so that information can no longer be reliably stored in the flash cell. An increased write amplification resulting in more program-erase cycles can reduce the operational life of the flash memory. Thus, reducing the write amplification can increase the performance and the longevity of the flash memory.

As described herein, the write amplification for a nonvolatile medium can potentially be reduced and read latencies can potentially be controlled by moving information within the nonvolatile medium based on an estimated probability distribution of future read latencies for the nonvolatile medium. For example, a distribution of read latencies of the nonvolatile medium can be specified, such as by using a service level agreement (SLA). The SLA can define a level of performance that a service provider (such as a provider of storage or compute services) will provide to a user of the services. The specified distribution of read latencies can classify reads from the nonvolatile medium into strata, where each stratum defines a maximum read latency. As a specific example, a distribution of read latencies can specify that for a given number of reads (e.g., $10^7$ or $10^8$ reads) from the nonvolatile medium, only 1% of reads can have latency longer than 100 microseconds (µs), 0.01% can have latency longer than 1 millisecond (ms), and 0.001% can have latency longer than 10 ms. For example, the SLA can specify that the following condition be satisfied:

$$P(tR > \tau_i) \leq P_i, i = 0, 1, \ldots \qquad (1)$$

where tR is the actual read time distribution of reads in the system for the specified number of read operations, i is the strata defined in the SLA, $\tau_i$ is the latency for the strata i, $P_i$ is the probability that the read latency will be less than $\tau_i$, and $P(tR > \tau_i)$ is the probability that the actual read time distributions exceed $\tau_i$.

Characteristics of the information stored on the nonvolatile medium can be tracked and/or managed in management units (also referred to herein as storage units), where a management unit can be one or more pages and/or physical blocks. For example, when fine-grain control over the information is desired, a management unit can be one or a few pages within a physical block. However, when more coarse-grain control over the information is desired, a management unit can be one or a few blocks. For example, various characteristics of the management units can be monitored, such as the read latency distribution for individual management units (tR(mu)), the read latency distribution for individual management units within the different stratum ((P(tR(mu) > \tau_i) = P_i(mu)), and a relative share of all read operations n(mu)) falling into each of the management units. Taking into account the effect of the individual management units, condition (1) can be rewritten as:

$$\Sigma_{mu} P(tR(mu) > \tau_i) \times n(mu) = \Sigma_{mu} P_i(mu) \times n(mu) \leq P_i, i = 0, 1 \ldots \qquad (2)$$

A management unit's individual contribution to the strata i can be defined as $\rho_i(mu) = P_i(mu)) \times n(mu)$. When $P_i(mu) \leq P_i$ for all management units, condition (2) will be satisfied with any read distribution n(mu) and so the integrity of the information stored on the nonvolatile medium can be maintained without moving any of the information.

However, during the operation of the nonvolatile medium, the data integrity of the information stored in the nonvolatile medium tends to become worse which can increase the read latency. For example, the nonvolatile medium can be a NAND flash and the management unit can be a plurality of flash pages and/or blocks. A media controller reading from the flash memory can include an error correction engine using Low-Density Parity Check (LDPC) codes. The error correction engine can use a LDPC decoding algorithm that employs an iterative algorithm using different types and/or numbers of read retry steps to recover data. For information stored with higher data integrity, the error correction engine can use fewer steps resulting in a shorter read latency, and for information stored with lower data integrity, the error correction engine can use more steps resulting in a longer read latency. Specifically, over the storage lifetime for a given piece of information stored in a given management unit, the stored information will lose data integrity. The error correction engine can use fewer steps to achieve a shorter read latency when the information is stored with a higher data integrity and the error correction engine can use more steps (e.g., read retries) to achieve a longer read latency when the information is stored with a lower data integrity. In one embodiment, a running average of the number of retries can be used as a measure of read latency for each individual management unit.

The information stored on the nonvolatile medium can be selectively moved within the nonvolatile medium based on the measured probability distribution of read latencies for the nonvolatile medium. For example, the distribution of the read latencies can be monitored until condition (2) is violated or is close to being violated. The read latencies can be monitored by maintaining a value of $P_i(mu)$ and $n(mu)$ for each management unit. For example, samples of $P_i(mu)$ and $n(mu)$ can be taken at an equal number of read operations. After a sample is taken, $\rho_i(mu)=P_i(mu) \times n(mu)$ can be calculated and a list of management units can be sorted for each SLA strata i and data from the management units with the highest value of $\rho_i(mu)$ can be relocated until condition (2) is satisfied. In other words, when condition (2) is violated or is close to being violated, a trigger can be generated to relocate information from the "worst" management units (e.g., the management units with the highest $p_i(mu)$). In this manner, the sums $\Sigma_{mu}\rho_i(mu)$ can potentially be kept below the predefined $P_i$ for all i values that are defined in the SLA. When the information from the "worst" management units is relocated to newly allocated management units, the data integrity of the stored information can be improved which can potentially improve the probability distribution of the read latencies (e.g., cause the distribution to have more smaller read latencies and less longer read latencies) of the nonvolatile medium. In this manner, the information stored in the nonvolatile medium can be moved to maintain the integrity of the information while potentially reducing the amount of data movement and reducing the write amplification compared to solutions where data is moved based on a predefined number of read accesses. Additionally, moving the information based on the read latencies can potentially protect the integrity of the information better than moving the data based only on the predefined number of reads, since the measured read latencies can provide an actual (rather than only specified) indication of the integrity of the information.

Example Architectures for Managing a Nonvolatile Medium

Figure 2:
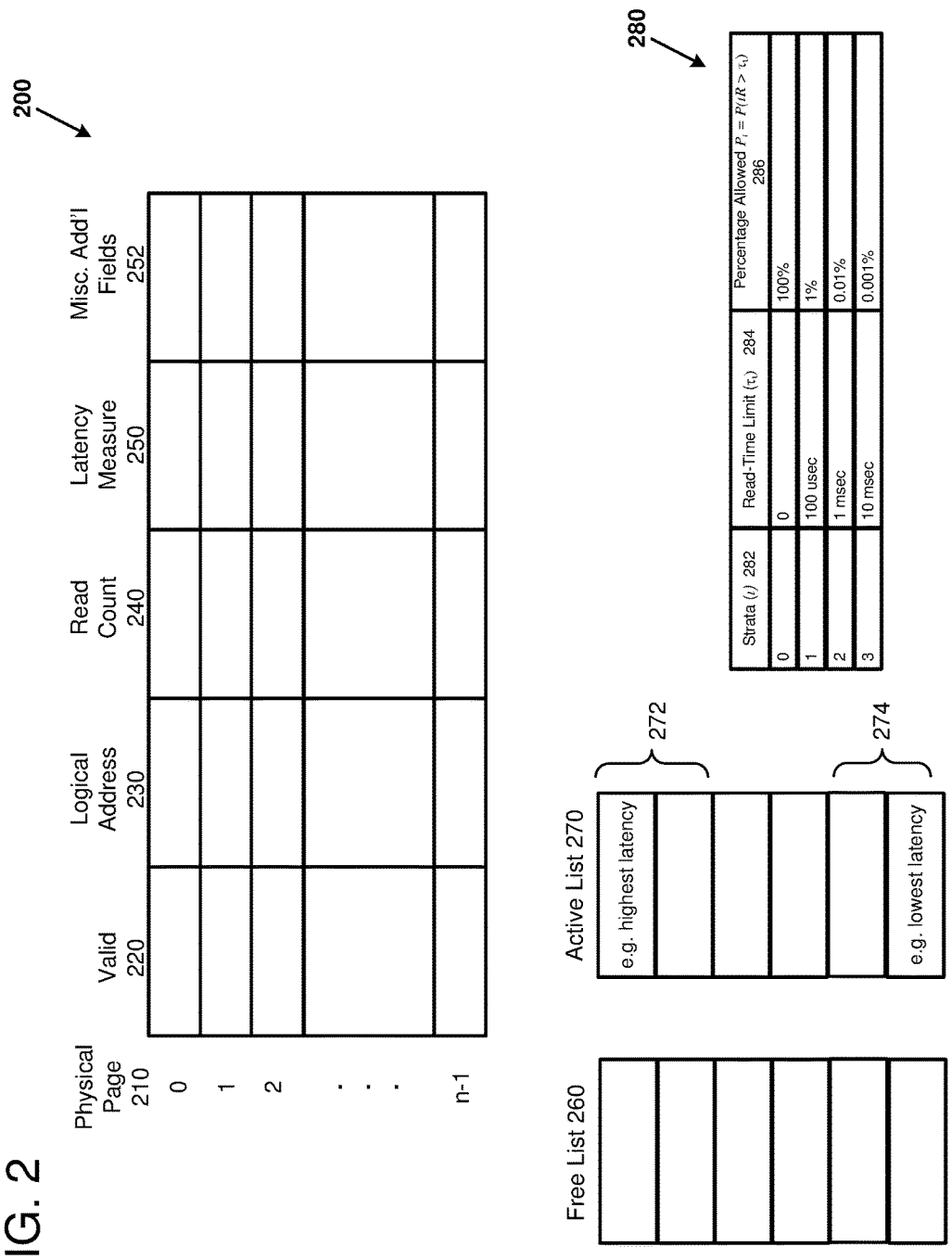
FIG. 2 illustrates an example of various data structures for managing the storage locations of and the information stored on a nonvolatile medium.
Figure 3:
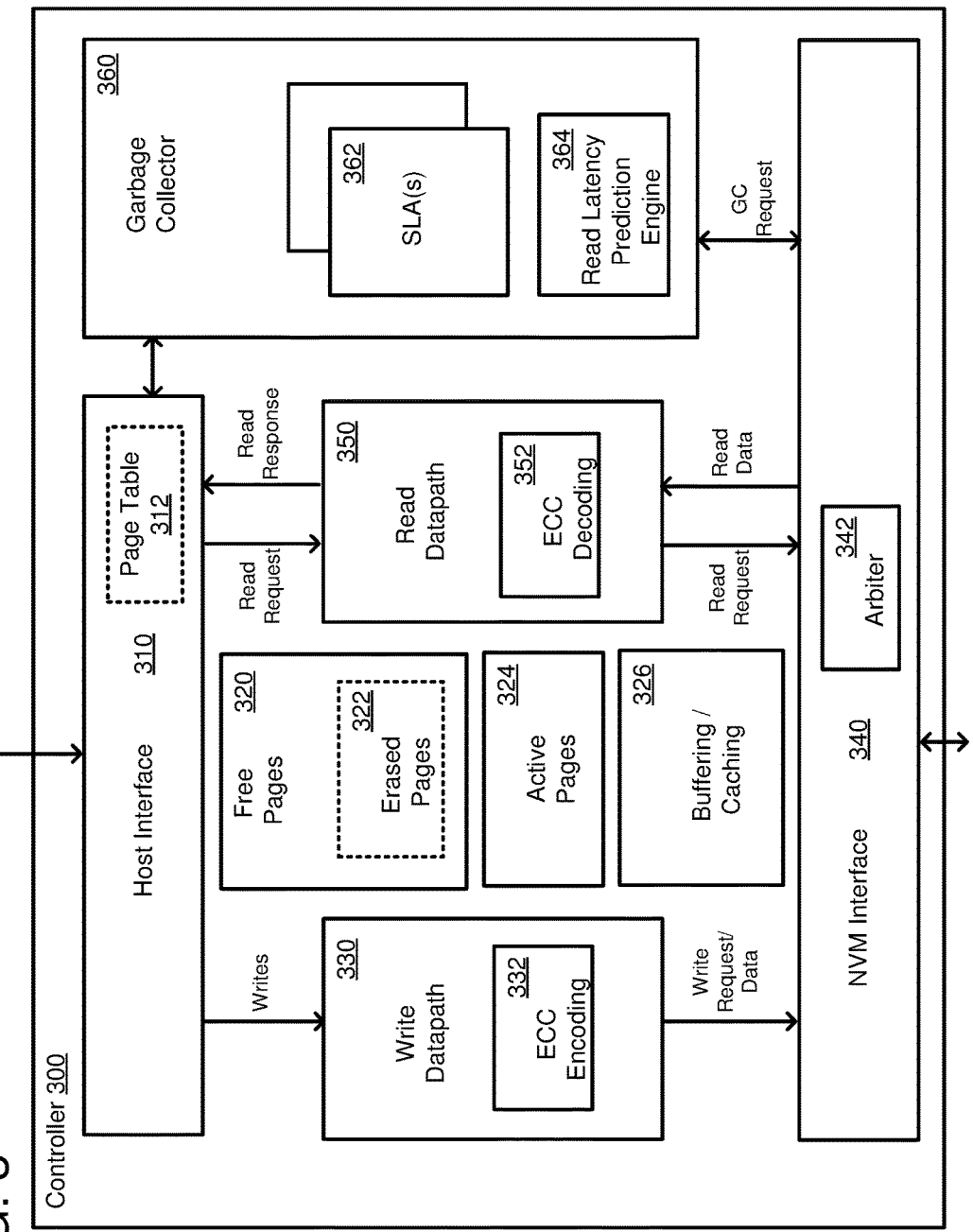
FIG. 3 is a system diagram showing an example of a controller for a nonvolatile storage device.
Figure 4:
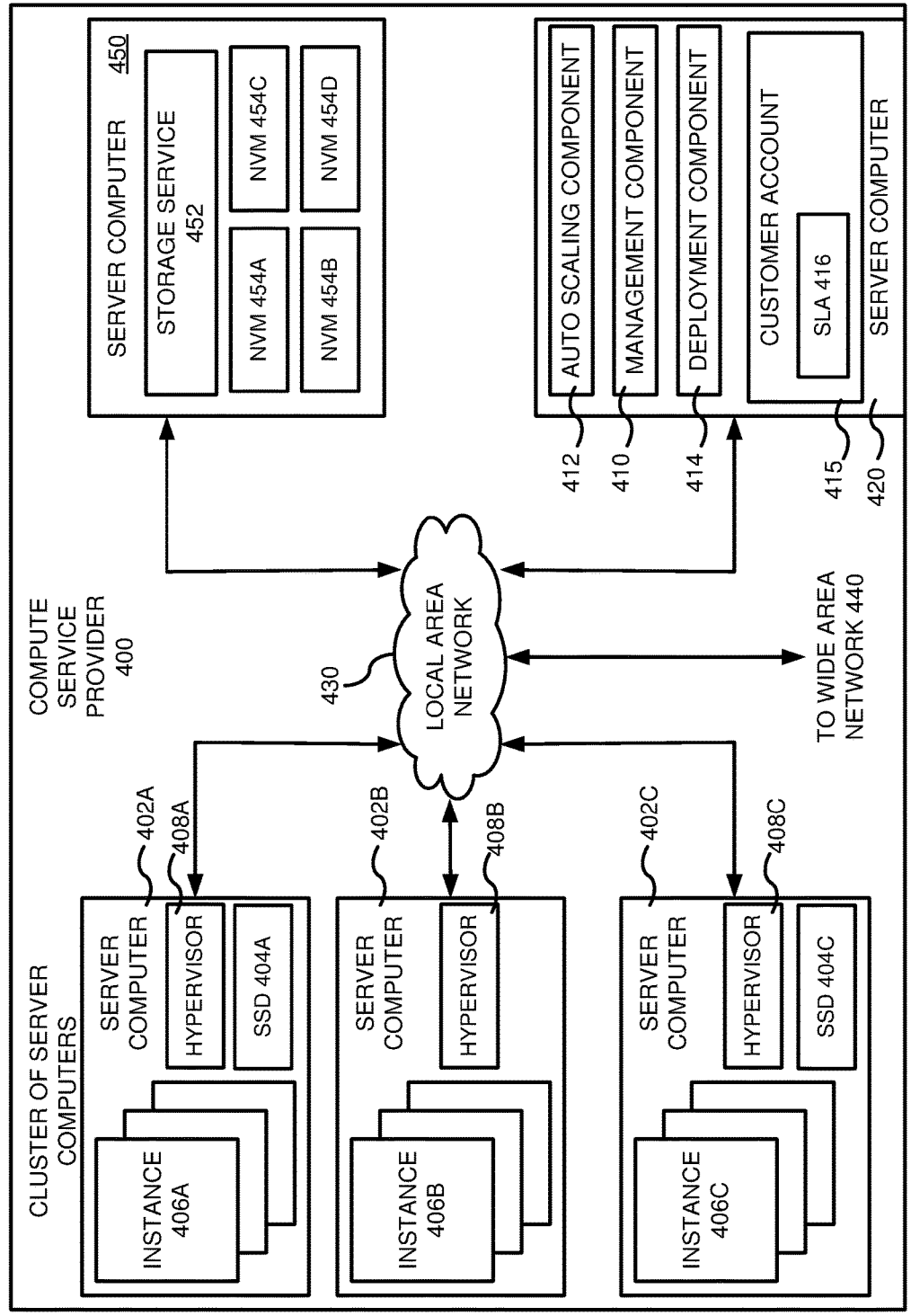
FIG. 4 is an example system diagram showing a plurality of virtual machine instances running in a multi-tenant environment including a storage service.

FIGS. 1-4 illustrate various aspects of an architecture for managing information stored on a nonvolatile medium. FIG. 1 is a system diagram showing an example of a nonvolatile storage device, such as a solid-state drive (SSD), including a controller and a nonvolatile medium. FIG. 2 illustrates various example data structures that can be used for managing the storage locations of the nonvolatile medium and the information stored on the nonvolatile medium. FIG. 3 is a system diagram showing an example of a controller for the nonvolatile storage device. FIG. 4 is an example system diagram showing an example multi-tenant environment (e.g., a cloud environment). The multi-tenant environment can include server computers that access local nonvolatile storage and/or network-accessible (e.g., remote) nonvolatile storage using a storage service.

FIG. 1 is a system diagram showing an example of a nonvolatile storage device 100 including a nonvolatile medium 110 and a controller 120. The nonvolatile medium 110 can be implemented using a variety of technologies, such as NAND flash memory, EEPROM, Ferroelectric RAM, and/or other technologies used for storing information that is retained after power is removed from the device. The nonvolatile medium 110 can include multiple physical blocks, such as block 112 and 114, for storing information. Each of the blocks can be organized as multiple pages and each block can be erased in a single operation. The nonvolatile memory 110 can further include control logic (not shown) for receiving commands from the controller 120. For example, the commands can include commands for reading a page of information, programming or writing a page of information, moving a page of information from one page to another page, and erasing a physical block.

The controller 120 can include hardware and/or software for interfacing with a host device and for managing the nonvolatile medium 110. As one example, the controller 120 can include a processor and memory used for storing data and instructions for managing the nonvolatile memory 110. As another example, the controller 120 can include circuits (e.g., computer hardware, such as an application-specific integrated circuit (ASIC)) that are programmed or hard coded to perform functions for managing the nonvolatile memory 110. The controller 120 can act as an interface between a host device and the nonvolatile medium 110. For example, the controller 120 can receive information from the host device to be written to the nonvolatile medium 110 and the controller 120 can cause the information to be stored on the nonvolatile medium 110. The controller 120 can receive a request from the host device to retrieve information that was stored on the nonvolatile memory 110 and a controller 120 can cause the information to be read from the nonvolatile memory 110 and delivered to the host device. Additionally, the controller 120 can perform management functions associated with the nonvolatile memory 110, such as maintaining the integrity of information stored on the nonvolatile memory 110, maintaining a mapping a host addresses to physical addresses of the nonvolatile memory 110, and managing placement of the information within the available storage locations (e.g., the physical blocks) of the nonvolatile memory 110. In particular, the controller 120 can include recorded latency data 130, a read latency prediction engine 140, a block manager 150, and a service level agreement (SLA) 160.

The recorded latency data 130 can include read latency data for each of the physical blocks of the nonvolatile memory 110. For example, the read latency data for each of the physical blocks can be measured as information is read from the blocks and the measured latency data can be stored in the recorded latency data 130. Additionally or alternatively, the recorded latency data 130 can include read latency data for individual pages and/or management units of the nonvolatile memory 110. As a specific example, the recorded latency data 130 can track a number of read-retries for each of the physical blocks of the nonvolatile memory 110. Additionally, an access frequency of each of the physical blocks can be maintained. For example, the access frequency can be maintained by recording a number of accesses to each of the individual blocks and dividing the number of accesses by the total number of accesses to the nonvolatile memory 110.

The read latency prediction engine 140 can use the recorded latency data 130 and other information, such as the access frequency of each of the blocks, to estimate a probability distribution of future read latencies for the nonvolatile medium 110. Thus, the estimated probability distribution of future read latencies can be based on the recorded latency data 130 for the individual blocks of the nonvolatile medium 110. As one example, the access pattern for future reads can be estimated as having the same or similar access pattern as used in the past. The read latency for an individual block can be estimated to be the last read latency for the individual block, a running average of the read latencies from the individual block, or based on a model of future read latencies for the individual block. As one example, the future read latency of a block can be modeled as a function of the number of reads to that block.

The block manager 150 can manage how the pages and/or blocks within the nonvolatile memory 110 are used. For example, the block manager 150 can maintain a free-list of blocks that do not contain any stored valid information. The free-list can include blocks that are erased and are ready to receive write data and blocks that contain data that is no longer valid and that will be erased before the block can be reprogrammed. The block manager 150 can erase the blocks with invalid information at predefined intervals or during idle periods when the host device is not requesting information be written to or read from the nonvolatile memory 110. The block manager 150 can select blocks from the free-list in a manner to increase a longevity of the nonvolatile memory 110. For example, the block manager 150 can select less frequently used blocks from the free list before using more frequently used blocks so that the program-erase cycles can be leveled between the different blocks. As another example, the block manager 150 can maintain an active-list of pages that contain valid information. The pages listed in the active-list can be referred to as active pages. The active-list can include references to all or a subset of the valid pages. As one example, the active-list can include references to pages that have recently been written to or read from. The entries of the active list can include a mapping from a host address to a physical address of the nonvolatile memory 110.

The block manager 150 can cause information to be moved within the nonvolatile memory 110 in order to maintain the integrity of the information and to keep an estimated probability distribution of read latencies within a specified probability distribution of read latencies. For example, the specified probability distribution of read latencies can be specified in the service level agreement 160. The block manager 150 can compare the estimated probability distribution of future read latencies from the read latency prediction engine 140 to the specified probability distribution of read latencies from the service level agreement 160. Specifically, the estimated and specified probabilities can be compared for each of the strata of the distributions. When it is estimated that the distribution of read latencies may exceed the specified probability distribution for a given strata, information stored on the nonvolatile memory 110 can be selected to be moved to a different block so that the estimated distribution of read latencies can be brought within the specified probability distribution for the given strata. The information to be moved can be selected from the blocks having the highest read latency and/or having the highest product of read latency and probability of access, for example. In this manner, the block manager 150 can keep the probability distribution of read latencies within the specified probability distribution of read latencies while potentially reducing write amplification.

As a specific example, information can be moved from the block 112 to the block 114 when it is determined that the estimated probability distribution of read latencies exceeds the specified probability distribution of read latencies. Prior to the move, a reference to the block 112 can be stored on an active-list indicating that the block 112 includes valid information. A reference to the block 114 can be stored on a free-list indicating that the block 114 is available to store valid information. The information stored in the block 112 can have reduced data integrity as indicated by a relatively high read latency. When it is determined that the estimated probability distribution of read latencies exceeds the specified probability distribution of read latencies, the information stored in the block 112 can be selected to be moved because of its relatively high read latency. The valid information of block 112 can be moved to the block 114 and the data structures associated with the blocks can be updated. Specifically, the reference to the block 112 can be removed from the active-list and added to the free-list, and the reference to the block 114 can be removed from the free-list and added to the active-list.

FIG. 2 illustrates an example of various data structures for managing the storage locations of and the information stored on a nonvolatile medium, such as the nonvolatile medium 110 of FIG. 1. The data structures can include a page table 200, a free list 260, an active list 270, and a probability distribution of read latencies 280.

The page table 200 can include various information about each of the physical pages of the nonvolatile medium. For example, the page table 200 can include an entry for each of the physical pages of the nonvolatile medium. The page table 200 can be organized similarly to the nonvolatile medium. For example, information about physical pages within a physical block can be located in physical proximity to information about other physical pages within the same physical block. In particular, if the block size is 64 pages than the first 64 entries can correspond to the 64 individual pages of physical block zero. Thus, an address of the entry within the page table 200 can correspond directly to a physical page 210.

As one example, an entry of the page table 200 can include a valid field 220, a logical address field 230, a read count field 240, a latency measure field 250, and/or miscellaneous additional fields 252. The valid field 220 can indicate whether the physical page has valid information stored within the physical page. When information is written to the physical page, the valid field 220 can be set to true and when information is deleted from the physical page, the valid field 220 can be set to false. The logical address field 230 can include a value representing a host address corresponding to the physical page. Thus, a host device can use a common address for the information stored at a physical address of the nonvolatile memory regardless of whether the information is moved to a different physical address of the nonvolatile memory. By separating the host or logical address from the physical address of the nonvolatile memory, a controller can manage the physical pages of the nonvolatile memory transparent to the host device. The read count field 240 can include a measure of how often the physical page is accessed. The read count field 240 can be used to determine a relative frequency that the physical page is accessed. The relative access frequency of the physical pages can be calculated at various intervals. For example, the relative access frequency can be calculated at a predetermined time interval or after a predetermined number of reads. Thus, the read count field 240 can include subfields corresponding to different quanta. As a specific example, the probability distribution of the read latencies can be specified over $10^7$ read accesses of the nonvolatile medium. However, the relative access frequency can be recalculated every $10^6$ read accesses. The read counts can be saved (e.g., in a sub-field of the read count field 240) each time that the relative access frequency is recalculated so that a rolling average can be kept for the relative access frequency. The latency measure field 250 can be used to determine a read latency of the physical page. For example, the latency measure field 250 can include one or more values representing an amount of time to read information from the physical page. As with the read count field 240, different subfields of the latency measure field 250 can be used to correspond to different quanta. As a specific example, the value representing the read latency can be a number of read-retries for the physical page. Miscellaneous additional fields 252 can be used to store additional information about the physical page, such as a mapping to a physical block, a program-erase cycle count, whether the physical block is erased, and so forth. In other embodiments, the entries of the page table 200 can include more or less information about the physical pages. Additionally or alternatively, some or all of the information described above for the physical pages can be kept for a block or a management unit. The management unit can include one or more pages and/or blocks of the nonvolatile medium.

The free list 260 can include a list of pages, blocks, and/or management units that do not contain valid information, but are available for storing information. The free list 260 can include references to unused blocks, erased blocks, and blocks containing only invalid information. The free list 260 can include fields describing the various states of the blocks on the list or the various states can be obtained by referencing the page table 200, for example. The active list 270 can include a list of pages, blocks, and/or management units that contain valid information. For example, when the items referenced on the active list 270 are larger than a physical page (e.g., a block or management unit) then at least a portion of the referenced item is valid. In particular, when the active list 270 references blocks, at least one page within the block is valid. The active list 270 can be organized based on a latency of the items on the active list 270. For example, the items on the active list 270 can be sorted so that the items having the highest read latencies are grouped together, such as within the group 272. Similarly, the items having the lowest read latencies can be grouped together, such as within the group 274. Rather than using only the read latencies to order the active list 270, additional properties can be used. For example, a product of the latency and the read access frequency can be used order the active list 270.

The data structure for the probability distribution of read latencies 280 can include various fields such as a strata field 282, a read-time limit field 284, and a percentage allowed field 286. The probability distribution 280 can be quantized into various numbers of categories or strata. As illustrated, there are four strata for the probability distribution 280. The read time limit field 284 can be used to set an upper bound for the read latencies of the corresponding strata. The percentage allowed field 286 can be used to set an upper bound for the percentage of reads falling within the corresponding strata. As a specific example, the strata zero defines a read time-limit of zero and specifies that 100% of the reads can exceed a read latency of zero; the strata one defines a read time limit of 100 µs and specifies that 1% of the reads can exceed a read latency of 100 µs; the strata two defines a read time limit of 1 ms and specifies that 0.01% of the reads can exceed a read latency of 1 ms; and strata three defines a read time limit of 10 ms and specifies that 0.001% of the reads can exceed a read latency of 10 ms. As illustrated by the example, the higher stratum can overlap the lower stratum. For example, the reads belonging to strata i also belong to the stratum i−1, i−2, and so forth. Alternatively, the stratum can be mutually exclusive. For example, the strata zero can indicate that at least 99% of the read latencies are within the strata (e.g., having read latencies between zero and 100 µs); the strata one can indicate that no more than 0.99% of the read latencies are within the strata (e.g., having read latencies between 100 µs and 1 ms); the strata two can indicate that no more than 0.009% of the read latencies are within the strata (e.g., having read latencies between 1 ms and 10 ms); and the strata three can indicate that no more than 0.001% of the read latencies are within the strata (e.g., having read latencies greater than 10 ms). As another example, the number of reads allowed to fall within a particular strata can be specified with an absolute number as opposed to a percentage. The number of reads within the strata can potentially be more meaningful when the total number of reads for all of the stratum match a fixed number of read operations, such as $10^7$ or $10^8$ read operations. Thus, a different data structure can be used to represent the probability distribution of read latencies over different ranges of time. For example, a first data structure can be used to represent the probability distribution for the first $10^7$ read operations, the second data structure can be used to represent the probability distribution for the next $10^7$ read operations, and so forth. By keeping multiple data structures corresponding to a range of times, statistics and trends can be determined over the range. For example, a rolling average can be computed.

The data structure for the probability distribution of read latencies 280 can be used to specify a probability distribution (such as in a SLA) and/or to record a measured probability distribution for a particular management unit and/or for an entire nonvolatile medium. A comparison of recorded measurements to specified requirements can potentially be straightforward when using the same data structure to both specify and record read latency measurements.

FIG. 3 is a system diagram showing an example of a controller 300 used to manage a nonvolatile medium and to act as an interface between a host device and the nonvolatile medium. The controller 300 can include hardware and/or software for interfacing with a host device and for managing a nonvolatile medium. As one example, the controller 300 can include a processor and memory used for storing data and instructions for managing the nonvolatile memory and interfacing with the host device. As another example, the controller 300 can include circuits (e.g., computer hardware) that are programmed or hard coded to perform functions for managing the nonvolatile memory and interfacing with the host device. The controller 300 can include a host interface 310 for interfacing with the host device, a nonvolatile memory interface 340 for interfacing with the nonvolatile medium, and a garbage collector 360 for performing various management functions associated with the nonvolatile medium without interaction from the host device.

The controller 300 can include a host interface 310 for interfacing with the host device. For example, the host interface can receive and service commands received from those device. In particular, the host interface can receive a write command for writing data to the nonvolatile medium, a read command for reading data from the nonvolatile medium, and a delete command for deleting data from the nonvolatile medium. Each command can refer to a particular storage location using an address for the location. The host device can use a set of logical addresses (e.g., virtual addresses) which can be translated to physical addresses corresponding to storage locations of the nonvolatile medium. The host interface 310 can perform a mapping between the logical and physical addresses and the mapping information can be stored in a page table 312. For example, the host interface 310 can select a page from the free pages 320 for storing information when the host interface 310 receives a write command. The free pages 320 can include erased pages 322 that are ready for programming and pages that are free but not yet erased. A reference to the selected page can be added to the active pages 324 when the information is written to the nonvolatile memory. As another example, the host interface 310 can determine the physical address corresponding to a logical address of a read command by searching the page table using the logical address as a key.

The host interface 310 can communicate write requests to a write datapath 330. The write datapath 330 can format the write information for storage onto the nonvolatile memory. For example, the write datapath 330 can include an error correcting code (ECC) encoding engine 332 for adding ECC information to the write data. The ECC information can be used to detect and potentially correct any errors in the write data that are introduced while the data is stored on the nonvolatile medium and/or when the data is a read off of the nonvolatile medium. The write request can be forwarded by the write data path 330 to the nonvolatile memory (NVM) interface 340.

The NVM interface 340 can arbitrate (such as by using an arbiter 342) between different requests of the controller 300. For example, write requests can arrive while read requests are being processed and garbage collection requests can be ongoing with read and write requests. The nonvolatile medium may have a single interface and so different computing requests are sequenced before being sent to the nonvolatile medium. A buffering and caching block 326 can be used to temporarily store data from a request that is waiting to be serviced. Additionally, the buffering and caching block 326 can include storage space for recently and/or commonly requested data. The NVM interface 340 can communicate with the nonvolatile medium using commands to perform functions such as reading a page, programming or writing a page, moving information from one page to another page, and erasing a block. Additionally, the NVM interface 340 can sequence the write data and/or the read data between the controller 300 and the nonvolatile medium. In this manner, the NVM interface 340 can be used to write information to the nonvolatile medium, read information from the nonvolatile memory, and manage the stored information within the nonvolatile memory.

The host interface 310 can receive a read request from the host device and communicate the read request to a read datapath 350. The read datapath 350 can forward the request to the NVM interface 340 so that the requested data can be read from the nonvolatile medium. The read datapath 350 can check the read data returning from the nonvolatile medium to confirm whether the read data includes any errors. If errors are detected, the read data path 350 can potentially correct the errors before forwarding the read response data back to the host interface 310 and then on to the host device.

The read datapath 350 can measure read latencies from the nonvolatile memory. As one example, the read latency can be measured as the time (e.g., the number of clock cycles) between when the read request is forwarded to the NVM interface 340 until the first bytes of the requested page are ready to be sent to the host interface 310 as read response data. Using this measure, delays caused by competing requests, such as for writing data or performing garbage collection operations, can be included in the measured read latencies. As another example, the read latency can be measured by recording a number of retries for the read data being retrieved from the nonvolatile medium. The read data returned from the nonvolatile medium may include errors, such as errors caused by a degraded integrity of the information stored on the nonvolatile medium. The data stored on the nonvolatile medium can be protected using error correcting codes so that any errors can be detected and potentially corrected. Correcting the read data can include an iterative procedure (such as performing one or more read retries of the nonvolatile medium) and the number of steps performed in the iterative procedure can be an indication of the read latency.

The read datapath 350 can include an ECC decoder 352 for performing error detection and error correction algorithms (such as LDPC decoding algorithms) to detect and/or correct erroneous information that is read from the nonvolatile medium. An LDPC decoding algorithm can use different levels of read retry steps, such as hard decoding and soft decoding. During hard decoding, only hard bit information is used to decode the data. Hard decoding may have weaker error correction capability than soft decoding, but hard decoding has relatively shorter latency (e.g., read time to) and consequently higher throughput. The ECC decoder 352 can be designed to follow a deterministic flow and so the actual read latency for each read retry step can be a known design parameter. Thus, the read time can be predicted for each page/block by tracking the number of different levels of read retries for each page or block. Additionally, the number of levels of read retries for a given page can trigger data movement from the page when the number of levels of retries exceeds a latency limit for the page.

The ECC decoder 352 can begin by using hard decoding (taking to read time) and transition to soft decoding only when hard decoding fails to decode the read data. Most read data is likely to be successfully decoded using only hard decoding. However, as the data integrity for the information weakens (such as when there have been many reads to the same page), additional steps including soft decoding can be performed. Soft decoding can perform additional soft bit reads and use both hard bit and soft bit information to decode the data. Hence soft decoding can have stronger error correction capability but longer latency and lower throughput than compared with hard decoding alone. As one example, a read retry flow design can have the read retry steps $RR_i$, where i=1, 2, . . . , n having corresponding read time numbers $t_i$, where $t_0 \ll t_1 \ll t_2$, and so forth. As one example, the exact number of read retry steps can be measured and recorded for each page. As another example, the number of read retry steps can be recorded with less precision for each page, since generally only those read retry steps with a read time approaching the latency step size as specified in a given strata of an SLA may be of relevance. The number of retries can be recorded for a particular page, a particular block, or a particular management unit. Specifically, the number of retries within a given number of reads of the nonvolatile medium can be recorded for a given management unit.

The garbage collector 360 can perform various management tasks associated with the nonvolatile medium. For example, the garbage collector 360 can: schedule free and non-erased pages to be erased so that the pages can be reprogrammed; store specified and/or measured probability distributions of read latencies (e.g., SLA(s) 362); and schedule the movement of information within the nonvolatile medium.

The host interface 310 can receive an SLA from the host device and can forward the SLA to the garbage collector 360 where the SLA can be stored. As one example, the SLA can be configured by the host device during initialization of the controller 300 or the SLA can be adaptively changed based on a particular application running on the host device. There can be multiple SLAs corresponding to different users of the nonvolatile medium. For example, a storage service or a storage device used in a cloud computing environment may allocate a given storage resource to multiple customers or users. Additionally, the types of applications using a particular storage system may change over time and so it can be desirable for the controller 300 to adaptively adjust during the operational lifetime of the controller 300.

The garbage collector 360 can include a read latency prediction engine 364 for predicting (e.g., estimating) a probability distribution for future read latencies of the nonvolatile medium. The probability distribution can be predicted at a granularity of a page, a block, or a management unit. For example, the read latency prediction engine 364 can predict the probability distribution for future read latencies based on the read latencies measured by the read datapath 350. As another example, the predicted probability distribution can be based on a predicted distribution of read accesses among the pages of the nonvolatile medium and the measured read latencies corresponding to the individual pages. The predicted distribution of read accesses among the pages can match a current distribution of read accesses among the pages or can account for trends in the measured distribution of read accesses among the pages. Similarly, the predicted probability distribution for future read latencies can match a current probability distribution of read latencies or can account for trends in the measured probability distribution of read latencies. As a specific example, for each management unit, a number of reads having a number of retry steps (rr(mu)) for a given number of reads of the nonvolatile medium can be recorded. A measure of the future read latency of the management unit can be estimated using the following formula:

$$P(tR(mu) > \tau_i) = rr(mu)/n(mu),$$

where rr(mu) is the number of retry steps for the management unit, and n(mu) is the number of reads of the management unit.

The read time distribution (e.g., tR(mu)) can be predicted for each page, block, or management unit of the nonvolatile medium. For the purposes of meeting the specifications of the SLA, the probability of the read time distribution tR(mu) should not be bigger than the specified probability distribution for the particular strata limit r, that is:

$$P_i(mu) = P(tR(mu) > \tau_i).$$

In one embodiment, the $P_i(mu)$ value can be supplied directly by the nonvolatile storage device upon a request by the controller. In another embodiment, the controller can calculate the $P_i(mu)$ value based on collected data. As one example, the $P_i(mu)$ value can be recalculated upon each read event for a management unit. In another embodiment, the $P_i(mu)$ value can be updated periodically by requesting information from nonvolatile storage device.

The garbage collector 360 can determine when and what information to move within the nonvolatile medium based on the predicted probability distribution in the specified probability distribution. Specifically, the garbage collector 360 can track a number of reads to the nonvolatile medium. When the number of reads of the nonvolatile medium exceeds a trigger value, the specified probability distribution of read latencies (e.g., from the SLA) can be compared to the predicted probability distribution for future read latencies. When the predicted probability distribution for future read latencies of a given strata exceeds the specified probability distribution for read latencies of the strata, the garbage collector 360 can schedule information to be moved in order to keep the generated probability distribution of future read latencies within the specified distribution of read latencies. As a specific example, the specified probability distribution can indicate that only 1% of reads to the nonvolatile medium can exceed a read latency of 100 µs. However, the read latency prediction engine 364 can predict that greater than 1% of the future reads may exceed a read latency of 100 µs. Based on this prediction, the garbage collector 360 can schedule information to be moved so that the predicted probability distribution of future reads can be brought back into specification.

The information to move can be selected from the pages, blocks, or management units contributing to higher read latencies from the nonvolatile medium. As one example, the information selected to be moved can be located in the pages, blocks, or management units having the highest latency. As another example, the information selected to be moved can be located in the pages, blocks, or management units having the highest product of latency and relative share of read accesses. The candidate information can be referenced and an active list which lists all of the active pages, blocks, or management units of the nonvolatile medium. The active list can be sorted and/or grouped so that the pages, blocks, or management units having similar contributions to the read latencies can be efficiently discerned. When the garbage collector 360 determines that information is to be moved from one page to another page, the garbage collector 360 can issue a request to the NVM interface 340 so that the information can be moved within the nonvolatile medium.

FIG. 4 is a computing system diagram of a network-based compute service provider 400 (e.g., a cloud provider) that illustrates one environment in which embodiments described herein can be used. Cloud computing is the use of computing resources (hardware and software) which are available in a remote location and accessible over a network, such as the Internet. Users are able to buy these computing resources (including storage and computing power) as a utility on demand. Cloud computing entrusts remote services with a user's data, software and computation. Use of virtual computing resources can provide a number of advantages including cost advantages and/or ability to adapt rapidly to changing computing resource needs. As described below, the users of the computing resources can use nonvolatile storage on a local instance of a computing resource or via a storage service. Performance characteristics (such as a probability distribution of read latencies) can be specified using a service level agreement.

FIG. 4 is a computing system diagram of a network-based compute service provider 400 that illustrates one environment in which embodiments described herein can be used. By way of background, the compute service provider 400 (i.e., the cloud provider) is capable of delivery of computing and storage capacity as a service to a community of end recipients. In an example embodiment, the compute service provider can be established for an organization by or on behalf of the organization. That is, the compute service provider 400 may offer a "private cloud environment." In another embodiment, the compute service provider 400 supports a multi-tenant environment, wherein a plurality of customers operate independently (i.e., a public cloud environment). Generally speaking, the compute service provider 400 can provide the following models: Infrastructure as a Service ("IaaS"), Platform as a Service ("PaaS"), and/or Software as a Service ("SaaS"). Other models can be provided. For the IaaS model, the compute service provider 400 can offer computers as physical or virtual machines and other resources. The virtual machines can be run as guests by a hypervisor, as described further below. The PaaS model delivers a computing platform that can include an operating system, programming language execution environment, database, and web server. Application developers can develop and run their software solutions on the compute service provider platform without the cost of buying and managing the underlying hardware and software. The SaaS model allows installation and operation of application software in the compute service provider. In some embodiments, end users access the compute service provider 400 using networked client devices, such as desktop computers, laptops, tablets, smartphones, etc. running web browsers or other lightweight client applications. Those skilled in the art will recognize that the compute service provider 400 can be described as a "cloud" environment.

The particular illustrated compute service provider 400 includes a plurality of server computers 402A-402C. While only three server computers are shown, any number can be used, and large centers can include thousands of server computers. The server computers 402A-402C can be selected from a set of homogeneous or heterogeneous resources. As illustrated, the server computers 402A and 402C include local bulk storage using solid-state drives 404A and 404B, respectively. The server computer 402B may not be configured with a solid-state drive but can access bulk storage using calls to a storage service 452 executing on a server computer 450. The server computers 402A-402C can provide computing resources for executing software instances 406A-406C.

In one embodiment, the instances 406A-406C are virtual machines. As known in the art, a virtual machine is an instance of a software implementation of a machine (i.e. a computer) that executes applications like a physical machine. In the example of virtual machine, each of the servers 402A-402C can be configured to execute a hypervisor 408 or another type of program configured to enable the execution of multiple instances 406 on a single server. Additionally, each of the instances 406 can be configured to execute one or more applications.

It should be appreciated that although the embodiments disclosed herein are described primarily in the context of virtual machines, other types of instances can be utilized with the concepts and technologies disclosed herein. For instance, the technologies disclosed herein can be utilized with storage resources, data communications resources, and with other types of computing resources. The embodiments disclosed herein might also execute all or a portion of an application directly on a computer system without utilizing virtual machine instances.

One or more server computers 450 can be configured to execute a storage service 452. The storage service 452 can receive requests from the instances 406A-C to store and retrieve information using bulk storage devices accessible to the storage service 452. For example, the bulk storage devices can include nonvolatile media 454A-D. While only four nonvolatile media 454A-D are shown, any number can be used. The individual bulk storage devices can be reserved for a particular user and/or can be shared by the users of the compute service provider 400. As a specific example, all or a portion of the nonvolatile memory 454A can be reserved for the use or executing instance 406A. As another example, the storage service 452 can allocate storage resources among the different nonvolatile memory 454A-D in a customer independent manner. The storage service 452 can manage the nonvolatile media 454A-D as described above.

One or more server computers 420 can be reserved for executing software components for managing the operation of the server computers 402 and the instances 406. For example, the server computer 420 can execute a management component 410. A customer can access the management component 410 to configure various aspects of the operation of the instances 406 purchased by the customer. For example, the customer can purchase, rent or lease instances and make changes to the configuration of the instances. The customer can also specify settings regarding how the purchased instances are to be scaled in response to demand. The management component can further include a policy document to implement customer policies. An auto scaling component 412 can scale the instances 406 based upon rules defined by the customer. In one embodiment, the auto scaling component 412 allows a customer to specify scale-up rules for use in determining when new instances should be instantiated and scale-down rules for use in determining when existing instances should be terminated. The auto scaling component 412 can consist of a number of subcomponents executing on different server computers 402 or other computing devices. The auto scaling component 412 can monitor available computing resources over an internal management network and modify resources available based on need.

A deployment component 414 can be used to assist customers in the deployment of new instances 406 of computing resources. The deployment component can have access to account information associated with the instances, such as who is the owner of the account, credit card information, country of the owner, etc. The deployment component 414 can receive a configuration from a customer that includes data describing how new instances 406 should be configured. For example, the configuration can specify one or more applications to be installed in new instances 406, provide scripts and/or other types of code to be executed for configuring new instances 406, provide cache logic specifying how an application cache should be prepared, and other types of information. The deployment component 414 can utilize the customer-provided configuration and cache logic to configure, prime, and launch new instances 406. The configuration, cache logic, and other information may be specified by a customer using the management component 410 or by providing this information directly to the deployment component 414. The instance manager can be considered part of the deployment component.

Customer account information 415 can include any desired information associated with a customer of the multi-tenant environment. For example, the customer account information can include a unique identifier for a customer, a customer address, billing information, licensing information, customization parameters for launching instances, scheduling information, auto-scaling parameters, previous IP addresses used to access the account, etc. As a specific example, the customer account information 415 can include a service level agreement (SLA) 416 that specifies operational characteristics of the resources, such as a probability distribution of read latencies from block storage. The SLA 416 can be used when initializing an instance for a customer and/or when establishing access credentials to the storage service 452. Specifically, the SLA 416 can include the specified probability distribution of read latencies for a particular nonvolatile medium used by the customer. By providing different SLAs for different customers, and using the SLAs to change the behavior of the block storage devices, the block storage devices (e.g., the SSDs 404A and 404C and the NVM 454A-D) can be customized for the individual customers. Thus, the service provider can potentially provide one or a few types of adaptable block storage platforms for all or most of the service provider's users which can potentially improve the maintainability and scalability of the computing resources while providing the users with different performance options.

A network 430 can be utilized to interconnect the server computers 402A-402C and the server computers 420 and 450. The network 430 can be a local area network (LAN) and can be connected to a Wide Area Network (WAN) 440 so that end users can access the compute service provider 400. It should be appreciated that the network topology illustrated in FIG. 4 has been simplified and that many more networks and networking devices can be utilized to interconnect the various computing systems disclosed herein.

Example Methods for Managing a Nonvolatile Medium

Figure 5:
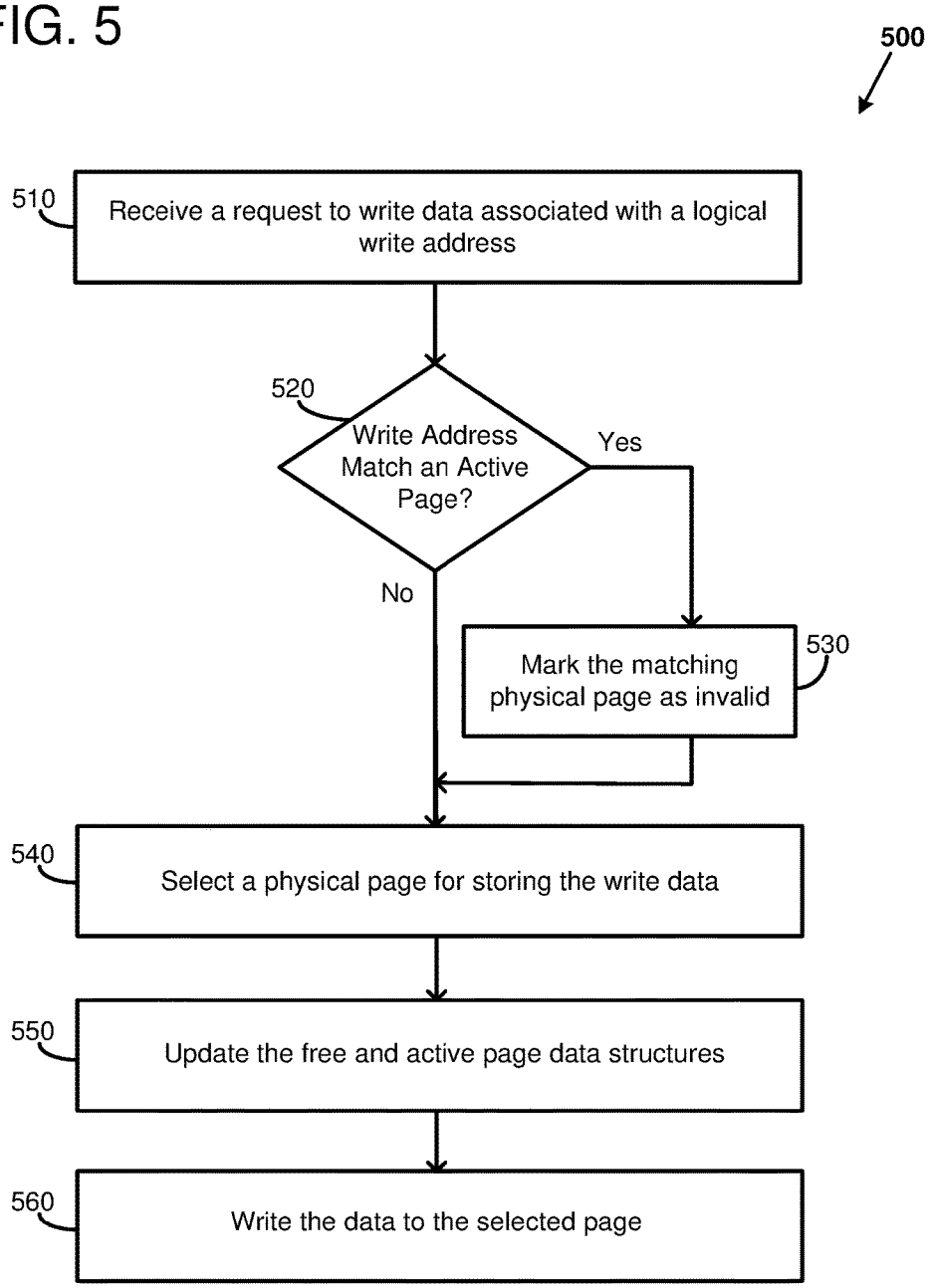
FIG. 5 is a flow diagram of an example method of writing information to the nonvolatile storage device.

FIG. 5 is a flow diagram of an example method 500 of writing information to the nonvolatile storage device. As one example, the method 500 can be implemented using a nonvolatile storage device architected as described above with reference to FIGS. 1-3. In particular, the method 500 can be implemented using a controller including a write datapath (e.g., pipeline) for writing to a nonvolatile storage device.

At 510, a request to write data associated with a logical write address can be received. As one example, the write data can be a page of data, and the logical write address can be the starting address of the page of data to write to the nonvolatile storage device.

At 520, the logical write address can be compared to other logical addresses corresponding to data that is stored on the nonvolatile storage device. For example, the other logical addresses can include the starting logical addresses of each of the pages of information stored on the nonvolatile storage device. The other logical addresses can be found in a page table and/or an active list of the nonvolatile storage device, and each entry of the page table and/or active list can include both a logical address of the information and a physical address of the information. If the write address corresponds to an active page then the nonvolatile storage device already has information associated with the write address stored on it. Thus, the information stored on the nonvolatile storage device and corresponding to the active page is no longer valid, and the method 500 can continue at 530. However, if the write address does not correspond to an active page then the nonvolatile storage device does not have any information associated with the write address stored on it, and the method can continue at 540.

At 530, the physical page matching the write address can be marked is invalid. The invalid physical page now includes invalid or stale information and the page can be erased and reused at a later time, such as during a garbage collection phase.

At 540, a physical page of the nonvolatile storage device is selected for storing the write data of the request. For example, the selected physical page can be selected from a free list data structure. The free list data structure can include pages with erased and/or invalid information. If the selected physical page is not erased, the selected physical page can be erased before the write data is written to the selected physical page.

At 550, the free and active data structures can be updated. For example, the free list data structure can be updated to include any physical page that may be invalidated at 530. As another example, the physical page selected at 540 can be removed from the free list data structure and added to the active list data structure. Additionally, any updates to the free list data structure and/or the active list data structure can be reflected in a page table.

At 560, the write data can be written to the nonvolatile storage device at the selected physical page. The write data can be encoded and/or augmented with error correction code (ECC) data before being written to the nonvolatile storage device. As one example, the controller can issue a write command to the nonvolatile storage device and can stream the write data (e.g., eight or sixteen bits at a time) and the ECC data to the nonvolatile storage device so that the write data can be stored.

Figure 6:
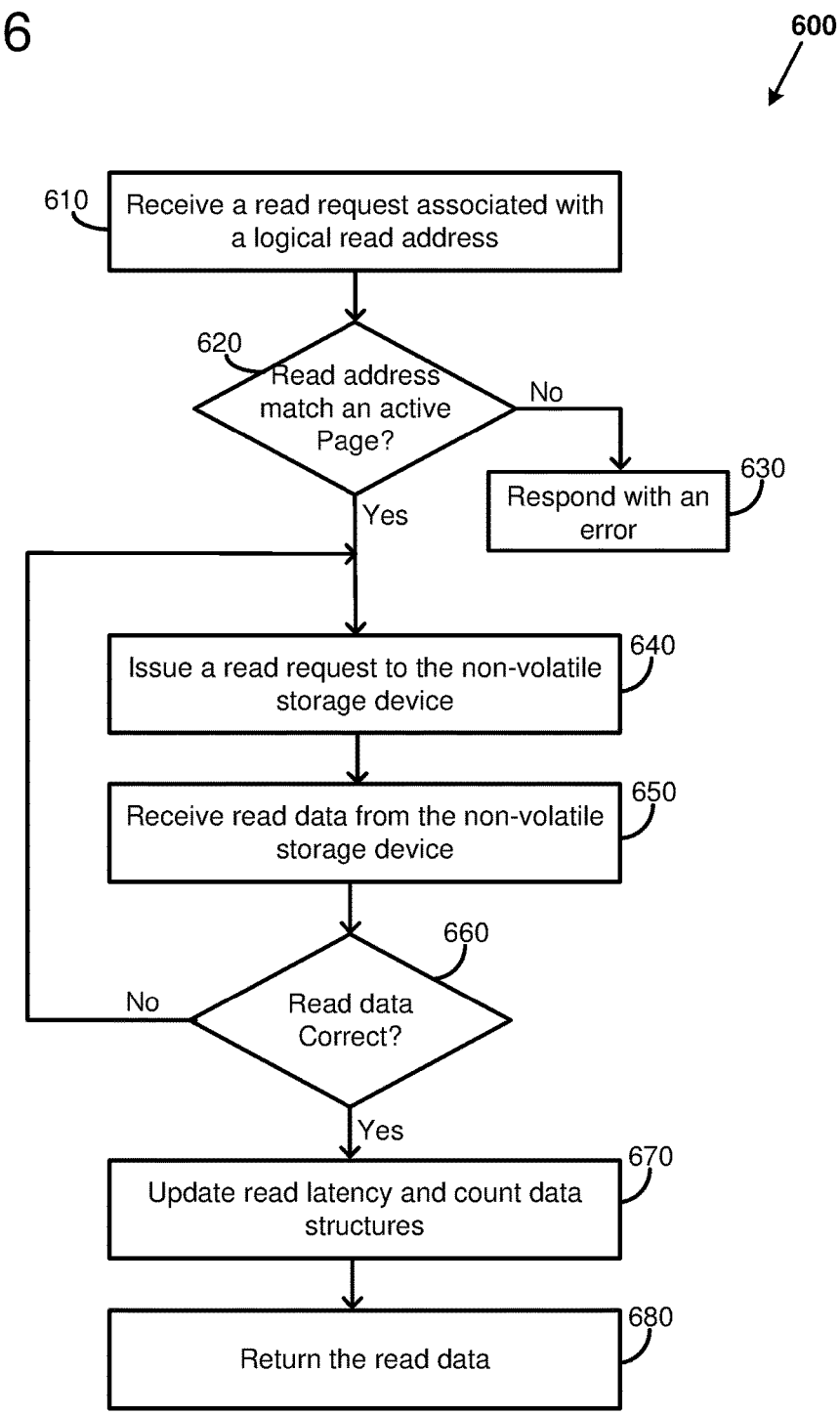
FIG. 6 is a flow diagram of an example method of reading information from the nonvolatile storage device.

FIG. 6 is a flow diagram of an example method of reading information from the nonvolatile storage device. As one example, the method 600 can be implemented using a nonvolatile storage device architected as described above with reference to FIGS. 1-3. In particular, the method 600 can be implemented using a controller including a read datapath (e.g., pipeline) for reading from a nonvolatile storage device.

At 610, a read request associated with a logical read address can be received. For example, the logical read address can be a starting address for a page of data to read from the nonvolatile storage device.

At 620, the logical read address can be compared to other logical addresses corresponding to data that is stored on the nonvolatile storage device. For example, the other logical addresses can include the starting logical addresses of each of the pages of information stored on the nonvolatile storage device. The other logical addresses can be found in a page table and/or an active list of the nonvolatile storage device, and each entry of the page table and/or active list can include both a logical address of the information and a physical address of the information. If the read address corresponds to an active page then the nonvolatile storage device already has information associated with the read address stored on it, and the method 600 can continue at 640. However, if the read address does not correspond to an active page then the nonvolatile storage device does not have any information associated with the read address stored on it, and the controller, at 630, can respond with an error.

At 640, a read request can be issued to the nonvolatile storage device. At 650, the nonvolatile storage device can respond with read data and/or error correction code (ECC) data. The read data may include errors which can be detected and potentially corrected using the read data and the ECC data.

At 660, the read data can be checked for errors, such as by using an ECC decoding algorithm. As one example, the ECC decoding algorithm can be an iterative decoding algorithm, such as when using LDPC codes. If the read data can be recovered without an error, the method 600 can continue at 670. However, if the read data cannot be recovered without an error then the ECC decoding algorithm may issue a new read request (at 640) to the nonvolatile storage device. For example, the LDPC decoding algorithm can begin with hard decoding that uses only hard bit information to decode the data. If the data cannot be recovered without error, the decoding algorithm can issue a new read request with different parameters so that soft decoding can be performed. There can be multiple layers of soft decoding, where each successive layer can take longer than the earlier layer, and where each successive layer causes a new read request (e.g., a read-retry) to be issued to the nonvolatile storage device. The decoding algorithm can stop when the data is recovered without error or when there are no decoding steps left to perform. If the data is not recovered without error at the end of all of the decoding steps, the method 600 can end (not shown) or the erroneous data can be returned to the host by continuing at 670. If the data is recovered without error, the method 600 can continue at 670.

At 670, the read latency and count data structures can be updated. For example, a count of the number of accesses of each page can be maintained so that the relative access frequency of each page can be calculated. In particular, a count associated with the logical read address or the physical read address can be incremented. As another example, a read latency of each page can be maintained. The read latency can be measured as a number of cycles and/or as a number of retry steps, for example. The read latency and count data structures can be used to calculate a measured distribution of reads and an estimated probability distribution of future read latencies.

At 680, the read data can be returned. As one example, a status flag accompanying the read data can indicate whether the read data is error-free or if the read data includes errors.

Figure 7:
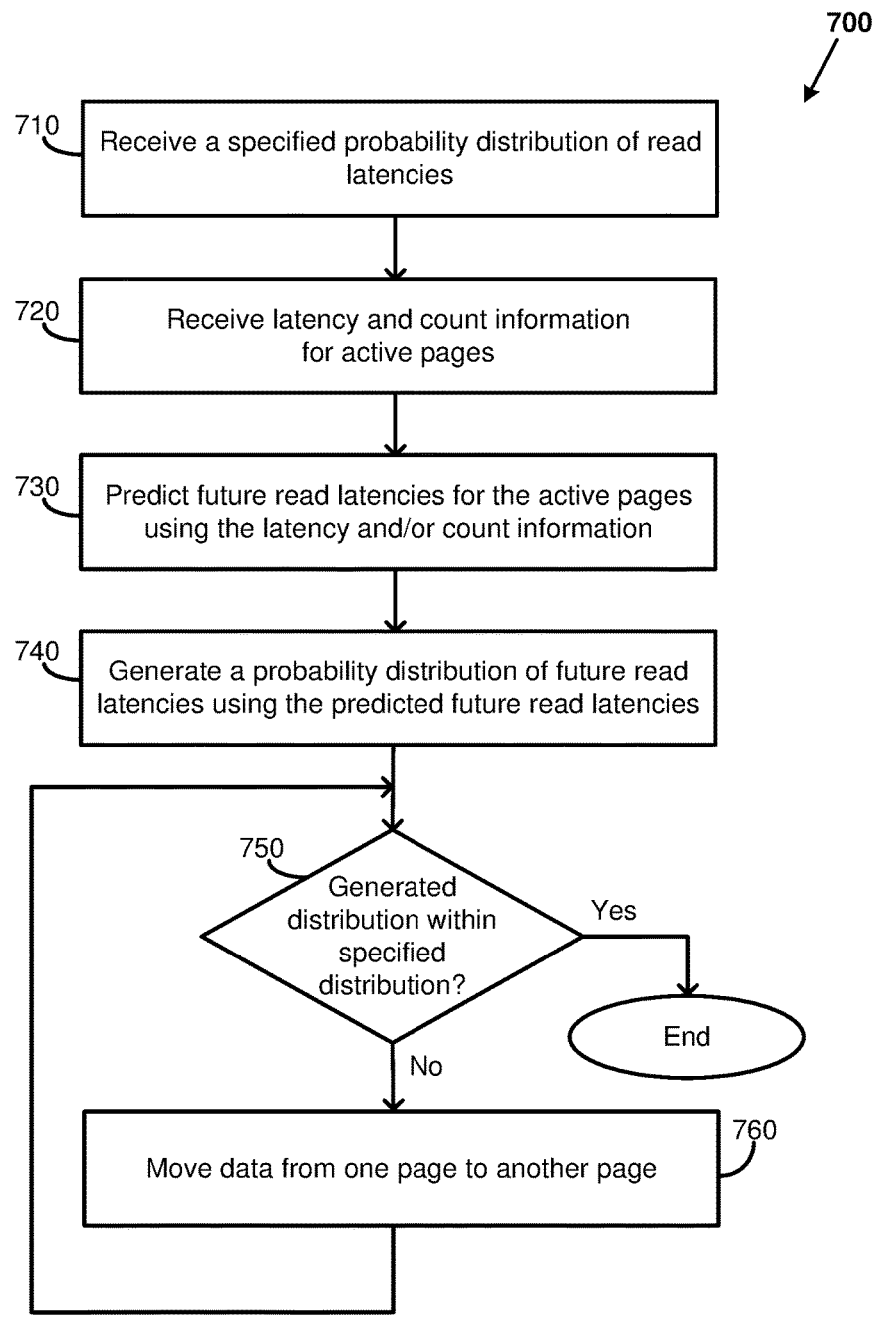
FIG. 7 is a flow diagram of an example method of managing information within the nonvolatile storage device.

FIG. 7 is a flow diagram of an example method 700 of managing the information stored on the nonvolatile storage device. As one example, the method 700 can be implemented using a nonvolatile storage device architected as described above with reference to FIGS. 1-3. In particular, the method 700 can be implemented using a controller for managing a nonvolatile storage device.

At 710, a specified probability distribution of read latencies can be received. For example, the specified probability distribution of read latencies can be part of a service level agreement. The probability distribution can be organized into different categories or strata, where each strata can define a maximum percentage of reads that exceed a time limit for the strata.

At 720, read latency and read count information can be received for active pages of the nonvolatile storage device. For example, of read latency for each read of the nonvolatile storage device can be measured. The read latency can be measured in time, clock cycles, read retries, or other measures indicating an elapsed period of time. The read count information can indicate a number of times that particular read address is accessed. For example, the read count for a particular read address can indicate how many times the read address is accessed within a given number of read accesses of the nonvolatile storage device. A relative frequency of accessing a particular read address can be determined by dividing the number of times the particular read address is accessed by the total number of times that the nonvolatile storage device has been accessed.

At 730, future read latencies for the active pages can be predicted using the latency and/or the count information received at 720. As one example, the future read latencies for each active page can be predicted to match the present read latencies of each active page. The relative frequency of each active page can be predicted to match the current relative frequency of each active page. Alternatively, the future read latencies and/or the future relative frequency of each active page can be predicted using access trends of the nonvolatile memory.

At 740, a probability distribution of future read latencies can be generated using the predicted future read latencies. For example, a contribution for each page to the probability distribution of future read latencies can be generated by multiplying the read latencies for each page by the probability that the page will be accessed.

At 750, the specified probability distribution (from 710) of read latencies can be compared to the generated probability distribution (from 740) of read latencies. For example, the probability distributions can be compared at each of the strata of the distributions. If it is predicted that a probability of the future read latencies within a strata may exceed the specified probability for that strata than the method 700 can continue at 760. However, if it is predicted that the probability of the future read latencies within each strata will not exceed the specified probability for the respective stratum, the method 700 can end.

At 760, data can be moved from one page of the nonvolatile storage device to another page of the nonvolatile storage device. For example, the information can be moved in order to keep the generated probability distribution of future read latencies within the specified distribution of read latencies. In this manner, data is only moved when it is predicted that a distribution of the future read latencies may be outside of a specified distribution of read latencies. Thus data can potentially be moved less often than if data were moved based strictly on a read count to each of the read addresses. By reducing the amount of data movement, write amplification can be reduced to increase performance, reduce energy consumption, an increase the operational lifetime of the nonvolatile storage device.

Figure 8:
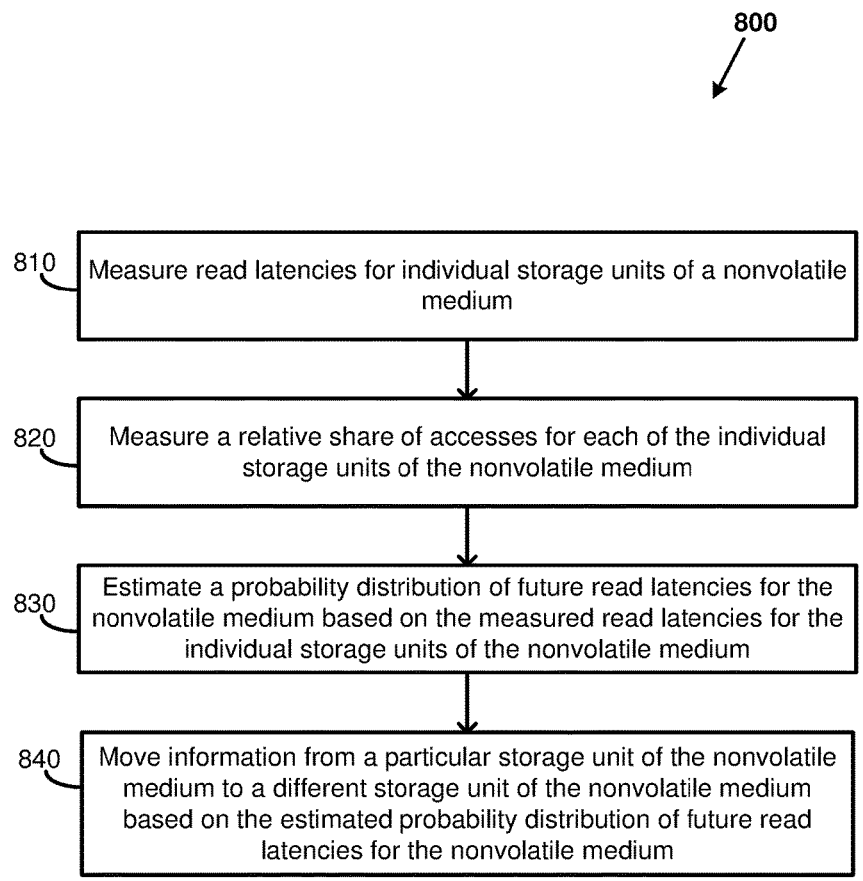
FIG. 8 is a flow diagram of managing a nonvolatile medium.

FIG. 8 is a flow diagram of a method 800 for managing a nonvolatile medium. The nonvolatile medium can be organized as a plurality of storage units. As one example, the storage unit can be a page of a NAND flash memory. As another example, the storage unit can be a block of a NAND flash memory, where the block is configured to be erased in a single operation. As another example, the storage unit can be a group of blocks of a NAND flash memory.

At 810, read latencies for the individual storage units of the nonvolatile medium can be measured. Measuring read latencies for the individual storage units of the nonvolatile medium can include counting a number of retries of reads from the individual storage units. Additionally or alternatively, measuring read latencies for the individual storage units of the nonvolatile medium can include calculating a running average of retries of reads from the individual storage units.

At 820, a relative share of accesses for each of the individual storage units of the nonvolatile medium can be measured.

At 830, a probability distribution of future read latencies for the nonvolatile medium can be estimated based on the measured read latencies for the individual storage units of the nonvolatile medium. For example, estimating the probability distribution of future read latencies for the nonvolatile medium can be based on the measured read latencies for the individual storage units and the relative share of accesses for each of the individual storage units.

At 840, information can be moved from a particular storage unit of the nonvolatile medium to a different storage unit of the nonvolatile medium based on the estimated probability distribution of future read latencies for the nonvolatile medium. For example, a list of the individual storage units of the nonvolatile medium can be sorted based on a contribution of the individual storage units to predicted future read latencies for the nonvolatile medium. The contribution of the individual storage units to the predicted future read latencies for the nonvolatile medium can be measured based only on a predicted read latency of the individual storage units. Alternatively, the contribution of the individual storage units to the predicted future read latencies for the nonvolatile medium can be measured based on a predicted read latency of the individual storage units and a likelihood of the individual storage units being accessed. The particular storage unit can be selected from a group of storage units having a highest contribution to the predicted future read latencies for the nonvolatile medium.

Example Computing Environment

Figure 9:
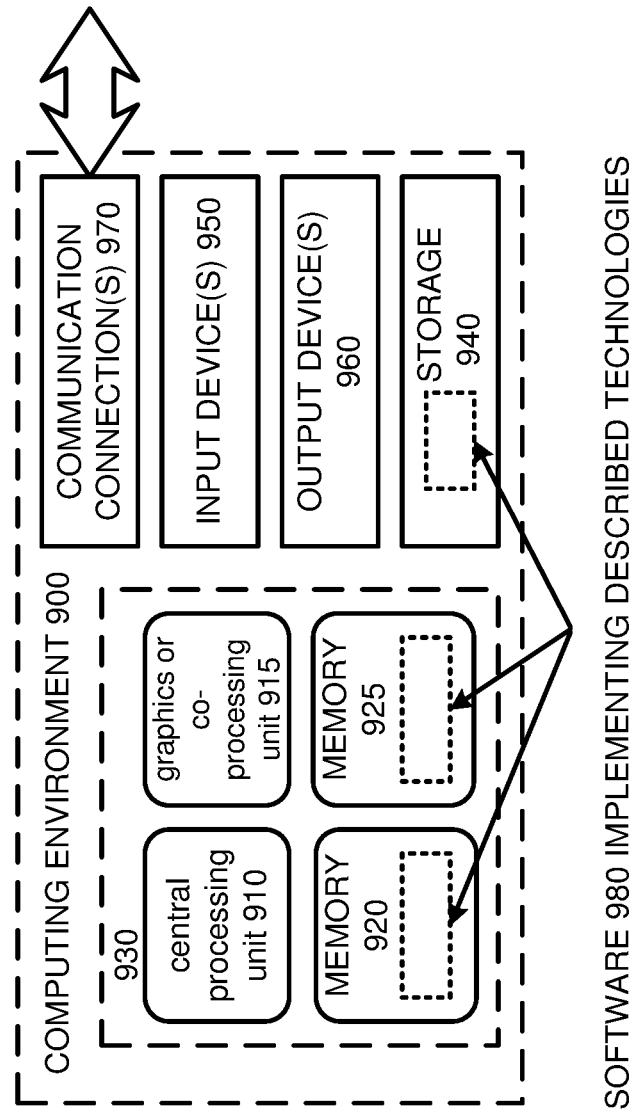
FIG. 9 depicts a generalized example of a suitable computing environment in which the described innovations may be implemented.

FIG. 9 depicts a generalized example of a suitable computing environment 900 in which the described innovations may be implemented. The computing environment 900 is not intended to suggest any limitation as to scope of use or functionality, as the innovations may be implemented in diverse general-purpose or special-purpose computing systems. For example, the computing environment 900 can be any of a variety of computing devices (e.g., desktop computer, laptop computer, server computer, tablet computer, etc.).

With reference to FIG. 9, the computing environment 900 includes one or more processing units 910, 915 and memory 920, 925. In FIG. 9, this basic configuration 930 is included within a dashed line. The processing units 910, 915 execute computer-executable instructions. A processing unit can be a general-purpose central processing unit (CPU), a processor in an application-specific integrated circuit (ASIC) or any other type of processor. In a multi-processing system, multiple processing units execute computer-executable instructions to increase processing power. For example, FIG. 9 shows a central processing unit 910 as well as a graphics processing unit or co-processing unit 915. The tangible memory 920, 925 may be volatile memory (e.g., registers, cache, RAM), nonvolatile memory (e.g., ROM, EEPROM, flash memory, etc.), or some combination of the two, accessible by the processing unit(s). The memory 920, 925 stores software 980 implementing one or more innovations described herein, in the form of computer-executable instructions suitable for execution by the processing unit(s).

A computing system may have additional features. For example, the computing environment 900 includes storage 940, one or more input devices 950, one or more output devices 960, and one or more communication connections 970. An interconnection mechanism (not shown) such as a bus, controller, or network interconnects the components of the computing environment 900. Typically, operating system software (not shown) provides an operating environment for other software executing in the computing environment 900, and coordinates activities of the components of the computing environment 900.

The tangible storage 940 may be removable or non-removable, and includes magnetic disks, magnetic tapes or cassettes, CD-ROMs, DVDs, or any other medium which can be used to store information in a non-transitory way and which can be accessed within the computing environment 900. The storage 940 stores instructions for the software 980 implementing one or more innovations described herein.

The input device(s) 950 may be a touch input device such as a keyboard, mouse, pen, or trackball, a voice input device, a scanning device, or another device that provides input to the computing environment 900. The output device(s) 960 may be a display, printer, speaker, CD-writer, or another device that provides output from the computing environment 900.

The communication connection(s) 970 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions stored on one or more computer-readable storage media (e.g., one or more optical media discs, volatile memory components (such as DRAM or SRAM), or nonvolatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in C++, Java, Perl, or any other suitable programming language. Likewise, the disclosed technology is not limited to any particular computer or type of hardware. Certain details of suitable computers and hardware are well known and need not be set forth in detail in this disclosure.

It should also be well understood that any functionality described herein can be performed, at least in part, by one or more hardware logic components, instead of software. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope of these claims.

What is claimed is:

1. A solid-state storage device comprising:
   a flash memory comprising a plurality of blocks; and
   a controller in communication with the flash memory, the controller configured to:
      determine a specified distribution of read latencies of the solid-state storage device;
      for each of the blocks of the flash memory, track a read latency and a relative share of accesses of the solid-state storage device;
      generate predictions of future read latencies for each of the blocks based on the tracked read latencies for each of the blocks;
      generate a probability distribution of future read latencies of the solid-state storage device based on the generated predictions of future read latencies for each of the blocks and the relative share of accesses for each of the individual blocks; and
      move information from one block of the flash memory to a different block of the flash memory to keep the generated probability distribution of future read latencies of the solid-state storage device within the specified distribution of read latencies.

2. The solid-state storage device of claim 1, wherein the block containing the information to be moved is selected from a group of blocks of the flash memory having the highest predicted future read latency.

3. The solid-state storage device of claim 1, wherein the block containing the information to be moved is selected based on a predicted future read latency and a likelihood of accessing the block containing the information to be moved.

4. The solid-state storage device of claim 1, wherein the specified distribution of read latencies of the solid-state storage device comprises a plurality of strata, and each stratum specifies a percentage of reads that can exceed a read latency of the stratum.

5. A method of managing a nonvolatile medium, the nonvolatile medium organized as a plurality of storage units, the method comprising:
   measuring read latencies for the individual storage units of the nonvolatile medium;
   measuring a relative share of accesses for each of the individual storage units of the nonvolatile medium;
   estimating a probability distribution of future read latencies for the nonvolatile medium based on the measured read latencies for the individual storage units and the relative share of accesses for each of the individual storage units; and
   moving information from a particular storage unit of the nonvolatile medium to a different storage unit of the nonvolatile medium based on the estimated probability distribution of future read latencies.

6. The method of claim 5, further comprising:
   sorting a list of the individual storage units of the nonvolatile medium based on a contribution of the individual storage units to predicted future read latencies for the nonvolatile medium.

7. The method of claim 6, wherein the particular storage unit is selected from a group of storage units having a highest contribution to the predicted future read latencies for the nonvolatile medium.

8. The method of claim 6, wherein the contribution of the individual storage units to the predicted future read latencies for the nonvolatile medium is measured based on a predicted read latency of the individual storage units.

9. The method of claim 6, wherein the contribution of the individual storage units to the predicted future read latencies for the nonvolatile medium is measured based on a respective predicted read latency of the individual storage units and a respective likelihood of the individual storage units being accessed.

10. The method of claim 5, wherein the storage unit is a page of a NAND flash memory.

11. The method of claim 5, wherein the storage unit is a block of a NAND flash memory, and the block is configured to be erased in a single operation.

12. The method of claim 5, wherein measuring read latencies for the individual storage units of the nonvolatile medium comprises counting a number of retries of reads from the individual storage units.

13. The method of claim 5, wherein measuring read latencies for the individual storage units of the nonvolatile medium comprises calculating a running average of retries of reads from the individual storage units.

14. An apparatus comprising:
   a nonvolatile medium comprising a plurality of pages; and
   a processor in communication with the nonvolatile medium, the processor configured to:
      determine read latencies for accessing individual pages of the nonvolatile medium;
      determine a distribution of reads of the pages of the nonvolatile medium;
      predict a probability distribution of future read latencies for the nonvolatile medium based on the determined read latencies for the individual pages and the distribution of the reads of the pages; and
      move information from an active page of the nonvolatile medium to a free page of the nonvolatile medium based on the estimated probability distribution of future read latencies.

15. The apparatus of claim 14, wherein the processor is further configured to:

generate a data structure containing references to pages having valid information and being associated with a read retry during a read of the valid information.

16. The apparatus of claim 15, wherein the active page containing the information to move is selected from the pages identified by the generated data structure.

17. The apparatus of claim 14, wherein the probability distribution of future read latencies for the nonvolatile medium comprises a predicted probability of exceeding a given read latency, and a trigger to move the information from the active page is when the predicted probability of exceeding the given read latency exceeds a specified probability of exceeding the given read latency.

* * * * *